United States Patent
Yang et al.

(10) Patent No.: US 9,093,520 B2
(45) Date of Patent: Jul. 28, 2015

(54) HIGH-VOLTAGE SUPER JUNCTION BY TRENCH AND EPITAXIAL DOPING

(71) Applicant: Taiwan Semiconductor Manufacturing Co., Ltd., Hsin-Chu (TW)

(72) Inventors: Tai-I Yang, Hsinchu (TW); Shou-Wei Lee, Hsinchu (TW); Shao-Chi Yu, Hsinchu (TW); Hong-Seng Shue, Zhubei (TW); Kun-Ming Huang, Taipei (TW); Po-Tao Chu, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/011,991

(22) Filed: Aug. 28, 2013

(65) Prior Publication Data

US 2015/0061007 A1 Mar. 5, 2015

(51) Int. Cl.
*H01L 29/78* (2006.01)
*H01L 29/66* (2006.01)
*H01L 29/06* (2006.01)
*H01L 21/762* (2006.01)

(52) U.S. Cl.
CPC ...... *H01L 29/7802* (2013.01); *H01L 21/76224* (2013.01); *H01L 29/0634* (2013.01); *H01L 29/66712* (2013.01)

(58) Field of Classification Search
CPC ........ H01L 29/78; H01L 29/66; H01L 21/762
USPC ....................................................... 257/337
See application file for complete search history.

(56) References Cited

U.S. PATENT DOCUMENTS

| | | | |
|---|---|---|---|
| 6,376,878 B1* | 4/2002 | Kocon | 257/328 |
| 6,406,982 B2 | 6/2002 | Urakami et al. | |
| 7,037,789 B2 | 5/2006 | Yamauchi et al. | |
| 7,811,907 B2 | 10/2010 | Shibata et al. | |
| 2002/0066924 A1* | 6/2002 | Blanchard | 257/328 |
| 2002/0070418 A1* | 6/2002 | Kinzer et al. | 257/496 |
| 2007/0029597 A1* | 2/2007 | Lee et al. | 257/302 |
| 2007/0052058 A1* | 3/2007 | Hirler et al. | 257/492 |
| 2012/0018800 A1* | 1/2012 | Kim | 257/330 |

\* cited by examiner

*Primary Examiner* — Marc Armand
*Assistant Examiner* — Younes Boulghassoul
(74) *Attorney, Agent, or Firm* — Eschweiler & Associates, LLC

(57) ABSTRACT

A high-voltage super junction device is disclosed. The device includes a semiconductor substrate region having a first conductivity type and having neighboring trenches disposed therein. The neighboring trenches each have trench sidewalls and a trench bottom surface. A region having a second conductivity type is disposed in or adjacent to a trench and meets the semiconductor substrate region at a p-n junction. A gate electrode is formed on the semiconductor substrate region and is electrically isolated from the semiconductor substrate region by a gate dielectric. A body region having the second conductivity type is disposed on opposite sides of the gate electrode near a surface of the semiconductor substrate. A source region having the first conductivity type is disposed within in the body region on opposite sides of the gate electrode near the surface of the semiconductor substrate.

12 Claims, 8 Drawing Sheets

HIGH-VOLTAGE SUPER JUNCTION BY TRENCH AND EPITAXIAL DOPING

BACKGROUND

A power MOSFET is a specific type of metal oxide semiconductor field-effect transistor (MOSFET) designed to handle significant power levels. The power MOSFET is the most widely used low-voltage (that is, less than 200 V) switch. It can be found in most power supplies, DC to DC converters, and low voltage motor controllers.

For higher voltages, such as above 500 V, some manufacturers have begun to use charge compensation or "super junction" techniques. By using such techniques, the resistance in epitaxial layers, which can be the largest resistance contributor in high voltage MOSFETs, can be reduced by a factor of greater than 5 compared to conventional techniques.

Engineers have developed deep trench super junction devices in an attempt to further enhance device performance. However, these conventional deep trench super junction devices suffer from shortcomings.

DETAILED DESCRIPTION

Figure 1:
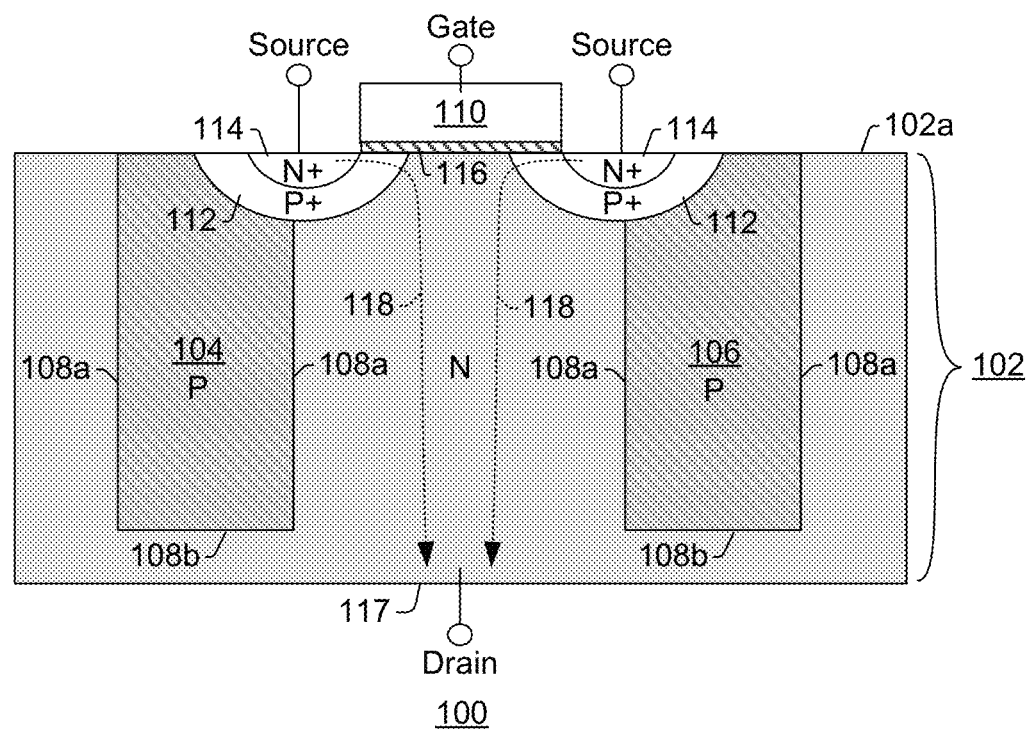
FIG. 1 shows a cross-sectional view of an integrated circuit that includes a high voltage super junction device in accordance with some embodiments.

One or more implementations of the present invention will now be described with reference to the attached drawings, wherein like reference numerals are used to refer to like elements throughout. The drawings are not drawn to scale.

FIG. 1 shows some embodiments of an integrated circuit that includes a high voltage (HV) super junction device 100 with improved performance characteristics. The HV super junction device 100 includes a semiconductor substrate region 102 which has a first doping type (e.g., n-type). The substrate region 102 has at least two neighboring regions 104, 106, which have a second conductivity type (e.g., p-type) and which meet the semiconductor substrate region 102 at p-n junctions 108. The p-n junctions 108 are substantially u-shaped or v-shaped in some embodiments, and as such have vertical junction components 108a and horizontal junction components 108b. A conductive gate electrode 110 is disposed on the semiconductor substrate region 102 and is disposed between neighboring regions 104, 106. Body regions 112, which have the second conductivity type (e.g., p-type), are disposed on opposite sides of the gate electrode 110 near a semiconductor substrate surface 102a. Source regions 114, which have the first conductivity type, are disposed within the body regions 112 on opposite sides of the gate electrode 110 near the semiconductor substrate surface 102a. A gate dielectric 116 electrically separates the gate electrode 110 from the substrate region 102, and in particular electrically separates the gate electrode from the body regions 112 to allow selective formation of a conductive channel in the body region 112 based on a gate voltage. A backside 116 of the substrate region 102 can act as a drain.

During operation, current selectively flows from the sources 114 to the drain 117 (or vice versa) based largely on a gate-source voltage ($V_{GS}$) and source-drain voltage ($V_{SD}$). For example, consider an example where the HV super junction device 100 is an n-type device with n-type source and drain regions 114/117 and p-type body regions 112 with a voltage threshold of 1.1 volts. In such a device, charge depletion occurs near pn junctions between the sources 114 and body regions 112, and near pn junctions between the body regions 112 and substrate/drain 102. Hence, if a gate voltage of 1.1 volts or greater is applied to the gate electrode 110, inversion occurs in the channel region of the body region 112 so electrical carriers (e.g., holes and electrons) are freed from the lattice and become mobile. When a source/drain voltage is applied, these now mobile electrical carriers are swept from source 114 to drain 117 (or vice versa) such that a current flows vertically between source 114 and drain 117 as shown by arrows 118. If the gate voltage is less than the threshold voltage, there is no inversion in the channel and current between source 114 and drain 117 is blocked. For a p-type device (not illustrated), the doping conventions and voltage biased are reversed, but selective current flow is still based on the biases applied to the device.

Thus, when formed in this way, the device 100 includes a vertical substrate region between the source region 114 and drain region 117 that acts as a resistive region. In particular, this resistive region lies along the vertical p-n junction 108a, and helps dissipate large voltages over its length thereby promoting a large breakdown voltage. This device 100 will consequently have a low on resistance ($R_{on}$), low power consumption, and high break down voltage. For example, in some implementations where the regions 104, 106 have a depth of 40 μm or more, the break down voltage can reach approximately 800 V.

Figure 2:
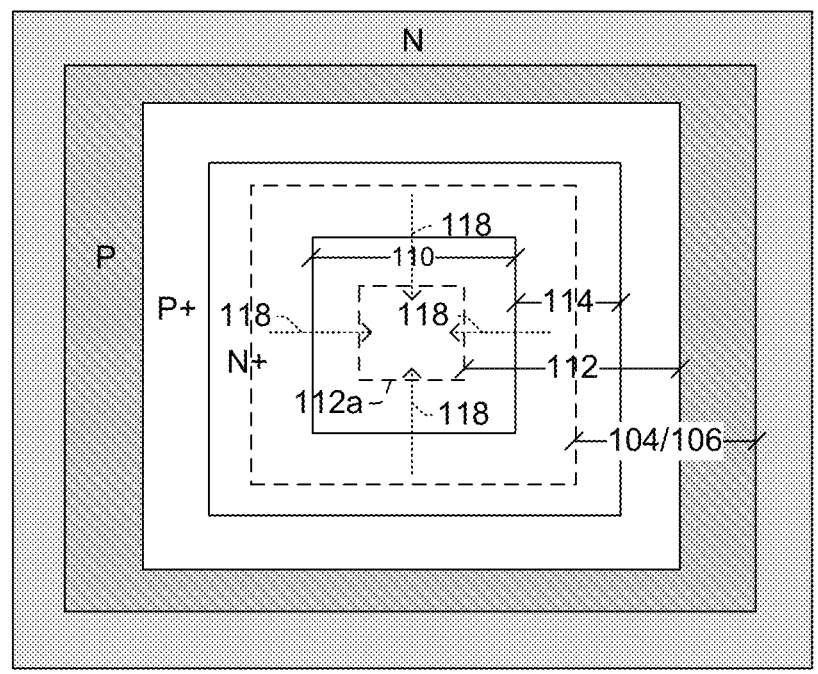
FIG. 2 shows a top view of an integrated circuit that includes a high voltage super junction device in accordance with some embodiments.

FIG. 2 shows one example of a top view consistent with FIG. 1's high voltage super junction device 100. Note that for purposes of clarity, not all layers or regions previously illustrated in FIG. 1 are shown in FIG. 2. As can be seen in FIG. 2, the N+ source region 114 laterally surrounds the gate electrode 110. In FIG. 2's example, the gate electrode 110 has a square shape, where an inner edge of the P+ body region 112a lies under the gate electrode 110. When a suitable bias condition is applied, current flows from the N+ source region 114 inwardly and downwardly to the drain region 117 as shown by arrows 118.

Figure 3:
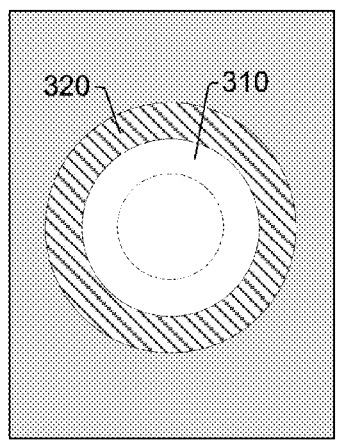
FIG. 3 shows a top view of an integrated circuit that includes a high voltage super junction device having a circular gate electrode in accordance with some embodiments.
Figure 4:
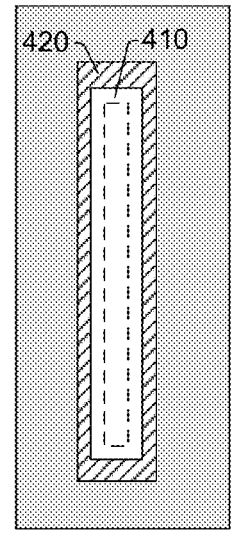
FIG. 4 shows a top view of an integrated circuit that includes a high voltage super junction device having a rectangular gate electrode in accordance with some embodiments.
Figure 5:
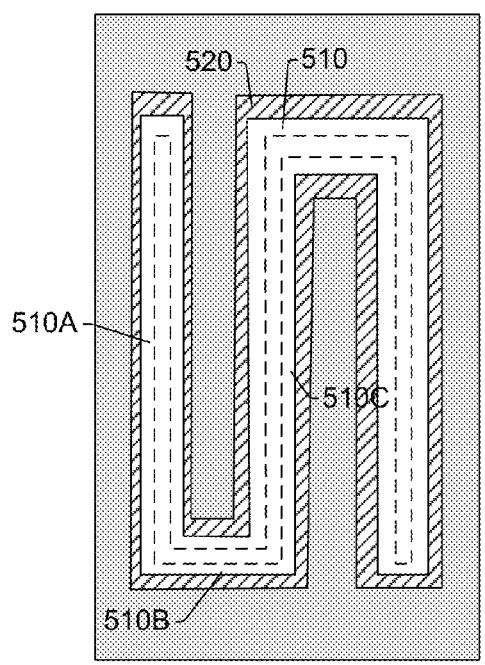
FIG. 5 shows a top view of an integrated circuit that includes a high voltage super junction device having a winding gate electrode in accordance with some embodiments.
Figure 6:
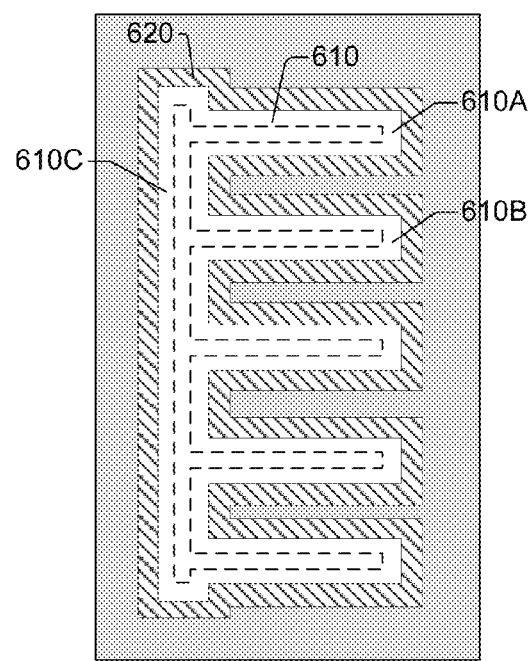
FIG. 6 shows a top view of an integrated circuit that includes a high voltage super junction device having a gate electrode with finger-like projections in accordance with some embodiments.

Although FIG. 2 shows an example of a top view where the gate electrode 110 has a square shape, other configurations are also possible. For example, FIG. 3 shows a gate electrode 310 that is circular in shape (with circular sidewall spacer 320) and FIG. 4 shows a gate electrode 410 that is rectangular in shape (with rectangular sidewall spacer 420). FIG. 5 shows a gate electrode 510 and spacers 520 that wind along several segments (e.g., 510A, 510B, 510C), which meet at right angles and which are electrically contiguous, and FIG. 6 shows another example where the gate electrode 610 and sidewall spacers 620 include a series of fingers (e.g., 610A, 610B) that branch off segment (610C). As will be appreciated, these are merely a few non-limiting examples of gate electrodes, and any number of variations of gate electrode shapes are contemplated as falling within the scope of this disclosure.

Figure 7:
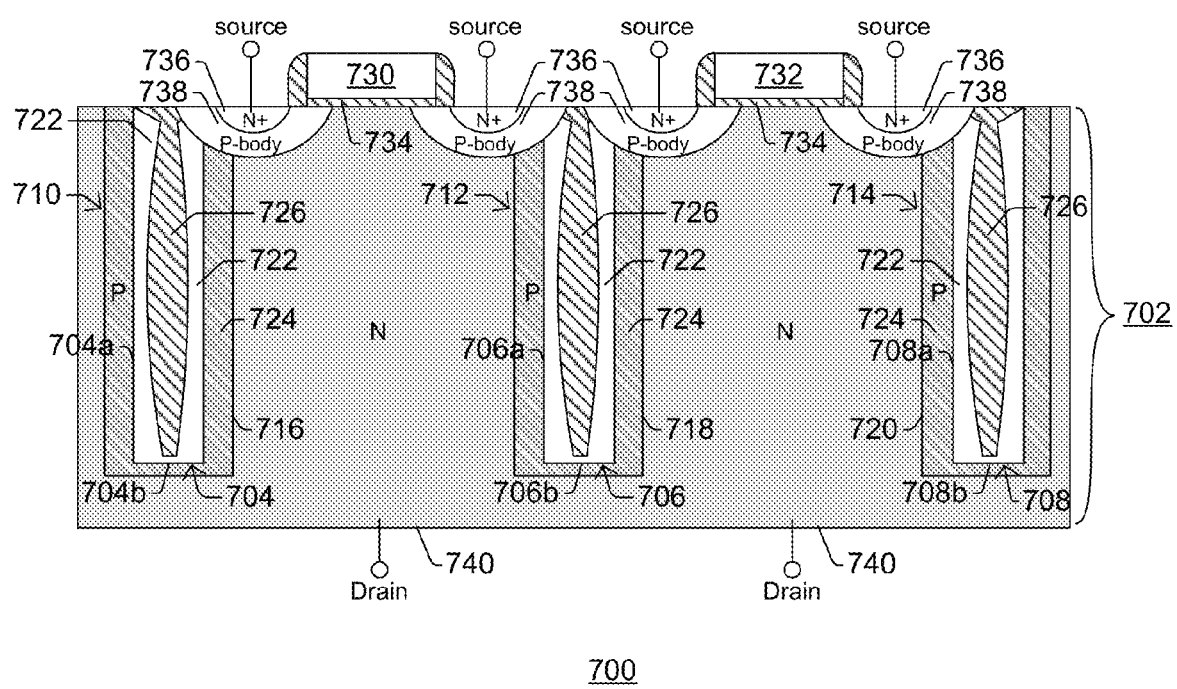
FIG. 7 shows a cross-sectional view of an integrated circuit that includes a high voltage super junction device in accordance with some embodiments.

FIG. 7 shows another cross-sectional view of another high voltage (HV) super junction device 700 in accordance with some embodiments. The HV super junction device 700 includes an n-type semiconductor substrate region 702 having at least two neighboring trenches (e.g., 704, 706, 708) disposed therein. Each trench (e.g., 704) has trench sidewalls (e.g., 704a) and a trench bottom surface (704b). P-type regions (e.g., 710, 712, 714) are disposed in or adjacent to the respective trenches and meet the n-type semiconductor substrate region 702 at p-n junctions (e.g., 716, 718, 720). Each p-type region (e.g., 710) comprises an epitaxial (EPI) p-type layer 722, which is disposed in the trenches, and an out-diffused p-type region 724, which is disposed in the substrate 702 about the trench sidewalls (e.g., about trench sidewall 704a) and under the bottom trench surfaces (e.g., under bottom trench surface 704b).

In some embodiments, the trenches have a height to width aspect ratio ranging from approximately 10:1 to approximately 50:1. For example, in some embodiments, the trench depth can range from approximately 30 µm to approximately 40 µm, and the trench width can range from approximately 1 µm to approximately 2 µm.

The EPI layer 722 has a recess which is defined by EPI sidewalls and a lower EPI region. A dielectric layer 726 is disposed within the recess of the EPI layer 722. The EPI sidewalls are thicker at upper and lower portions of the trench and which are thinner at a middle portion of the trench.

Conductive gate electrodes (e.g., 730, 732) are disposed on the semiconductor substrate region 702 between neighboring trenches. For example, gate electrode 730 is arranged between trenches 704 and 706. The gate electrodes can include sidewall spacers, which are optional, and a gate dielectric 734, which electrically isolates the conductive gate electrode from a channel region in the substrate 702.

N-type source regions 736 and a p-type body regions 738 are disposed on opposite sides of the gate electrodes near a surface of the n-type semiconductor substrate 702. A channel region in the body regions 738 selectively blocks and allows current flow between the n-type source region 736 and a backside drain region 740 depending on the bias applied to the device 700.

Figure 8:
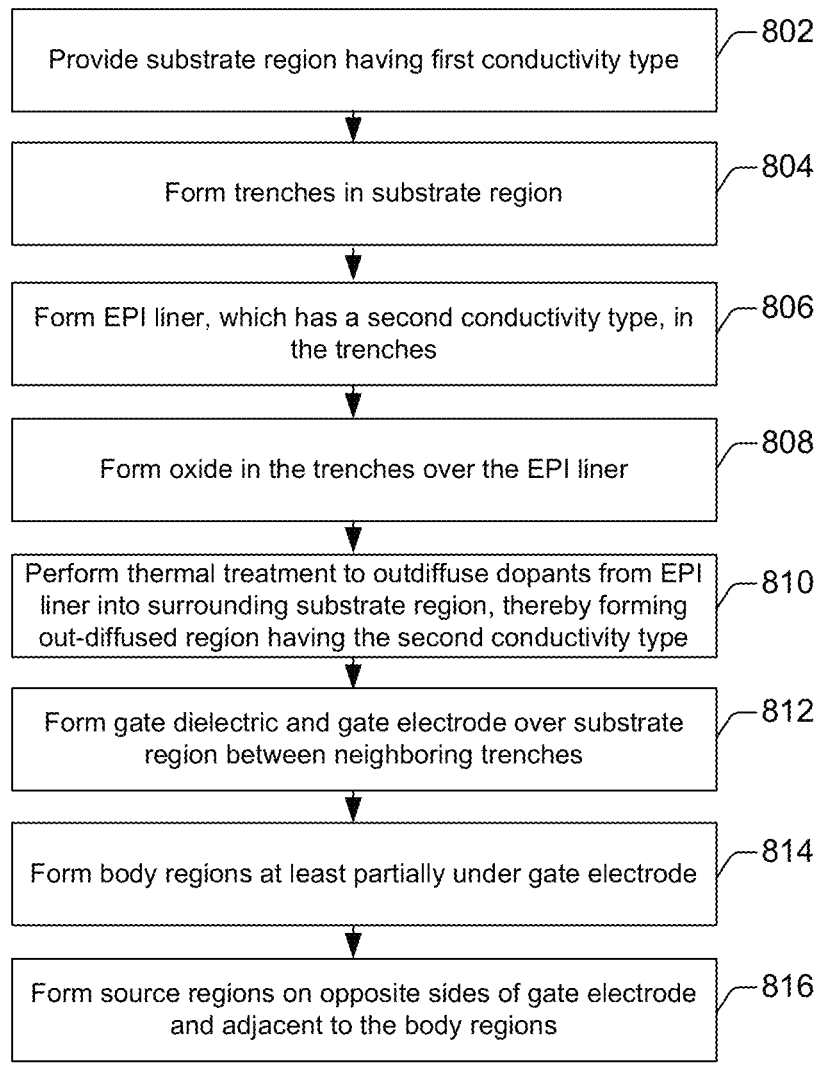
FIG. 8 shows a methodology of manufacturing a high voltage super junction device in accordance with some embodiments in flow chart format.

To illustrate some embodiments of how such a device can be manufactured, FIG. 8 illustrates a somewhat general manufacturing method in flowchart format while FIGS. 9-19 collectively illustrate a more detailed manufacturing method as a series of cross-sectional views. It will be appreciated that although these methods each illustrate a number of acts, not all of these acts are necessarily required, and other un-illustrated acts may also be present. Also, the ordering of the acts in some embodiments can vary from what is illustrated in these figures. In addition, the illustrated acts can be further divided into sub-acts in some implementations, while in other implementations some of the illustrated acts can be carried out concurrently with one another.

FIG. 8's method 800 starts at 802 where a semiconductor substrate region, which has a first conductivity type, is provided. At 804, trenches are formed in the semiconductor substrate region. In 806, an epitaxial (EPI) liner, which has a second conductivity type, is formed in the trenches. In 808, an oxide or other fill layer is formed in the trenches over the EPI liner. In 810, a thermal treatment is performed to out-diffuse dopants from the EPI liner into a surrounding portion of the semiconductor substrate region, thereby forming out-diffused region having the second conductivity type. In 812, a gate dielectric and a gate electrode are formed over the semiconductor substrate region between neighboring trenches. In 814, body regions are formed at least partially under the gate electrode in the semiconductor substrate region. In 816, source regions are formed on opposite sides of the gate electrode and adjacent to the body regions.

Figure 9:
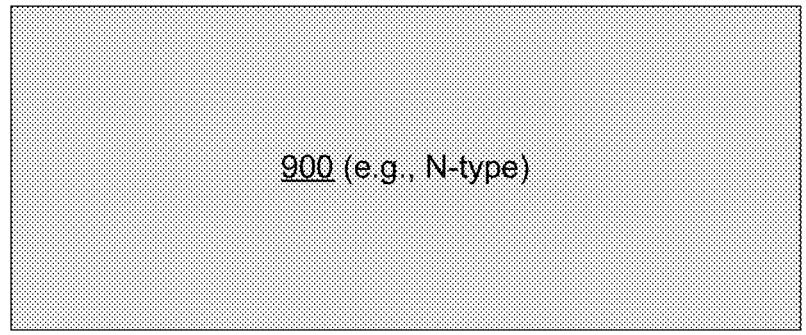
FIGS. 9-19 show a series of cross-sectional views that collectively depict another method of manufacturing a high voltage super junction device in accordance with some embodiments.

A more detailed methodology is now discussed with regards to FIGS. 9-19, which collectively depict a series of cross-sectional views at various stages during manufacture of the device. FIG. 9 illustrates an n-type substrate region 900 that is provided at the start of method. The n-type substrate region 900 can be a bulk region of an n-type semiconductor wafer, or an n-well region in a p-type semiconductor wafer. Further, it will be appreciated that "semiconductor substrate" or "wafer" as referred to herein may comprise any type of semiconductor material including a bulk silicon wafer, a binary compound substrate (e.g., GaAs wafer), a ternary compound substrate (e.g., AlGaAs), or higher order compound wafers, with or without additional insulating or conducting layers formed thereover, among others. Further, the semiconductor substrate can also include non semiconductor materials such as oxide in silicon-on-insulator (SOI), partial SOI substrate, polysilicon, insulator, oxide, metal, amorphous silicon, or organic material, among others. In some embodiments, the semiconductor substrate can also include multiple wafers or dies which are stacked or otherwise adhered together. The semiconductor substrate can include wafers which are cut from a silicon ingot, and/or any other type of semiconductor/non-semiconductor and/or deposited or grown (e.g. epitaxial) layers formed on an underlying substrate. Although FIG. 9 shows the substrate region as being n-type, the illustrated doping conventions could be flipped in other embodiments so the substrate region could also be p-type in some instances.

Figure 10:
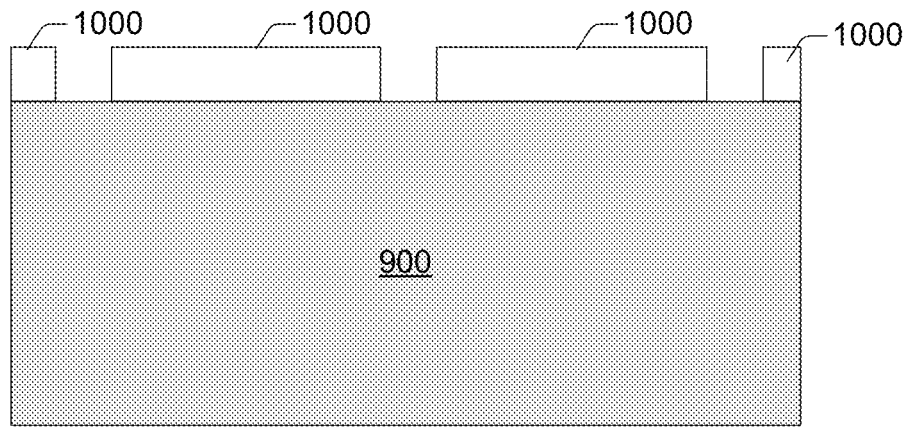

In FIG. 10, a hard mask, such as a nitride mask, is formed over the underlying substrate. A photoresist layer is formed and patterned (not shown) over the hardmask. With the patterned photoresist layer in place over the hardmask, an etch is carried out to form a patterned hardmask 1000.

Figure 11:
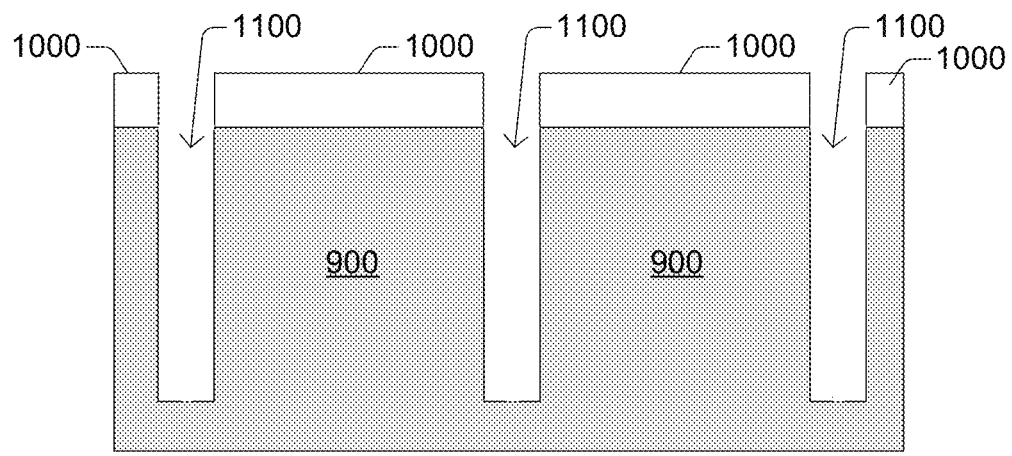

In FIG. 11, an etch is carried out with the patterned hardmask 1000 in place to form trenches 1100 in the n-type semiconductor region 900. The trenches 1100 have sidewalls and a bottom surface. In some embodiments, the trenches 1100 have a trench depth ranging from approximately 30 µm to approximately 40 µm, and a trench width ranging from approximately 1 µm to approximately 2 µm.

Figure 12:
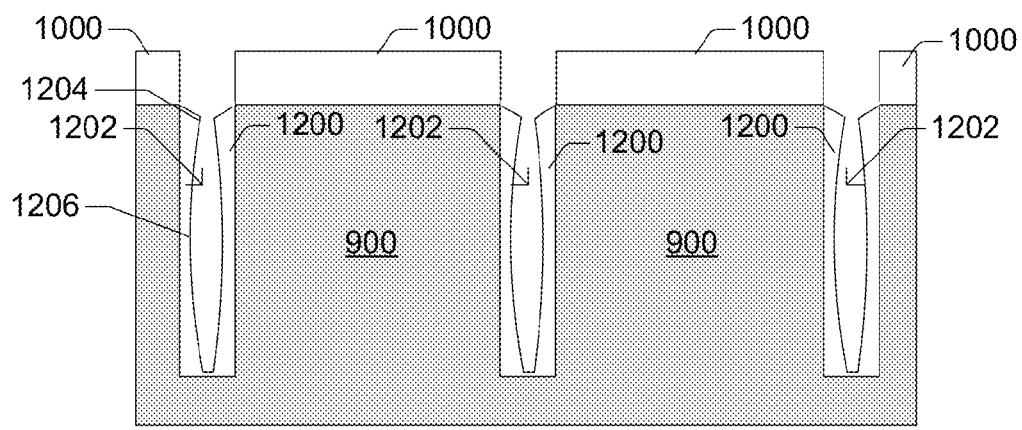

In FIG. 12, a p+ liner layer 1200 is epitaxially deposited in the trenches 1100 so as to leave a trench or recess 1202 in the trench over the p+ liner layer 1200. This epitaxial deposition can be selective to the silicon (i.e., not form on the hardmask layer). Because of this selective deposition, the p+ liner layer 1200 may tend to deposit more quickly at upper and lower regions of the trench. Thus, moving down the trench, the p+ liner can extend inwardly from a trench sidewall to a neck region 1204, before tapering outwardly to a waist region 1206 and then extending inwardly again toward the bottom of the trench. Hence, the p+ liner layer 1200 may be thicker at upper and lower regions of the trench and thinner in a middle region of the trench, and may have a recess or trench remaining in an upper surface thereof after its formation.

Figure 13:
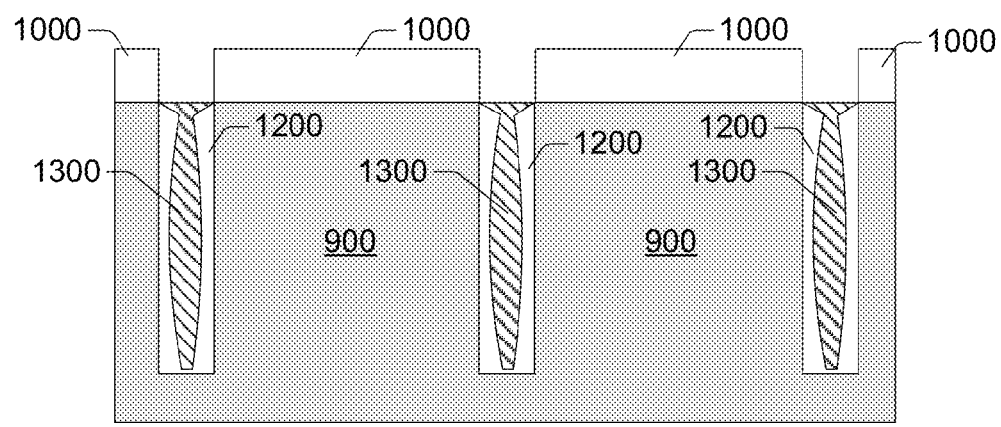

In FIG. 13, a dielectric layer 1300 is formed in the recess 1202 within the p+ liner layer 1200. In some embodiments, the dielectric layer is an oxide layer, such as silicon dioxide. In other embodiments, however, the dielectric layer 1300 can be a nitride, where a mixture of hydrochloric acid and dichlorosilane is used to fill the recess over the p+ layer. Materials other than a dielectric can also be used to fill recess 1202, however, may result in a lower breakdown voltage for the device.

Figure 14:
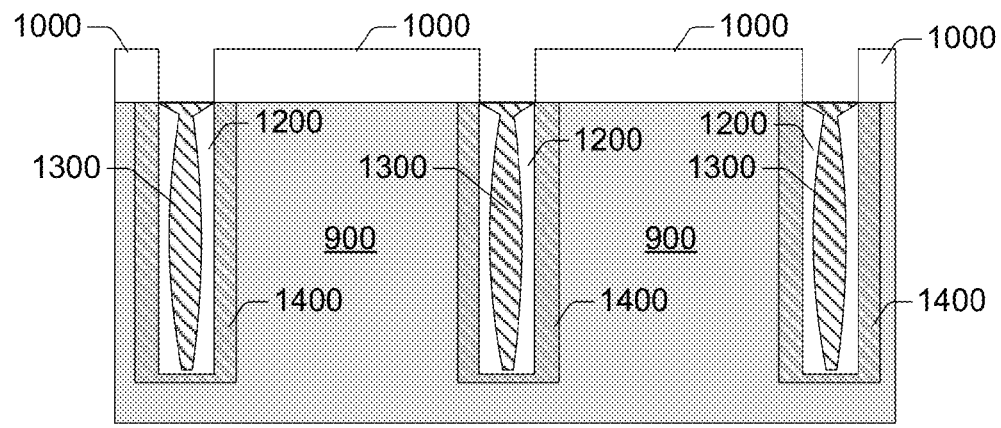

In FIG. 14, a thermal process is used to drive in the p+ dopants from the p+ liner layer 1200 into the surrounding n-type substrate region 900, thereby forming an out-diffused p+ region 1400. For example, in one embodiment, the wafer can be subjected to a heat treatment of approximately 1000° C.-1200° C. for approximately 1 hour to out-diffuse the p+ dopants approximately 2 μm to 3 μm into the surrounding n-type substrate.

Figure 15:
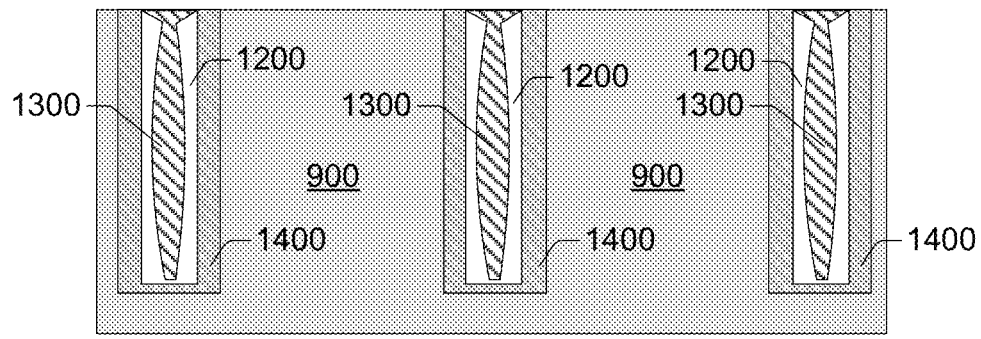

In FIG. 15, the hard mask is removed.

Figure 16:
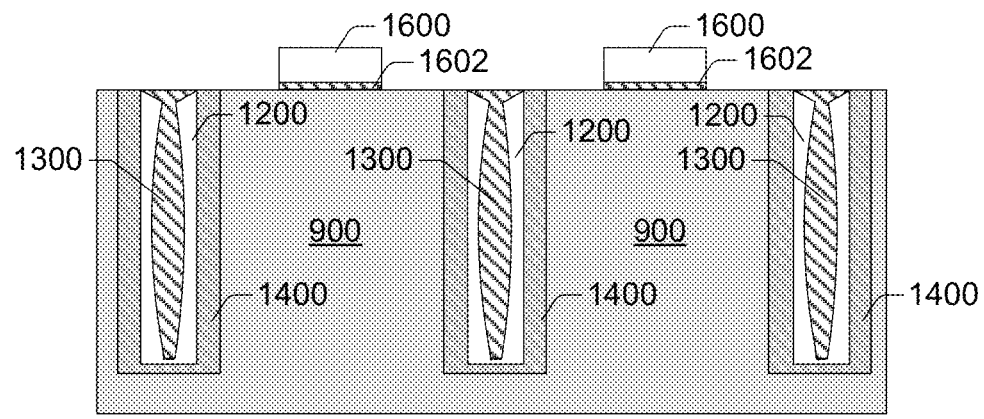

In FIG. 16, a polysilicon gate layer is formed over the substrate 900, and is patterned to form conductive gate electrodes 1600. The gate electrodes 1600 are formed between neighboring trenches, and are electrically isolated from the substrate region 900 by a gate dielectric 1602.

Figure 17:
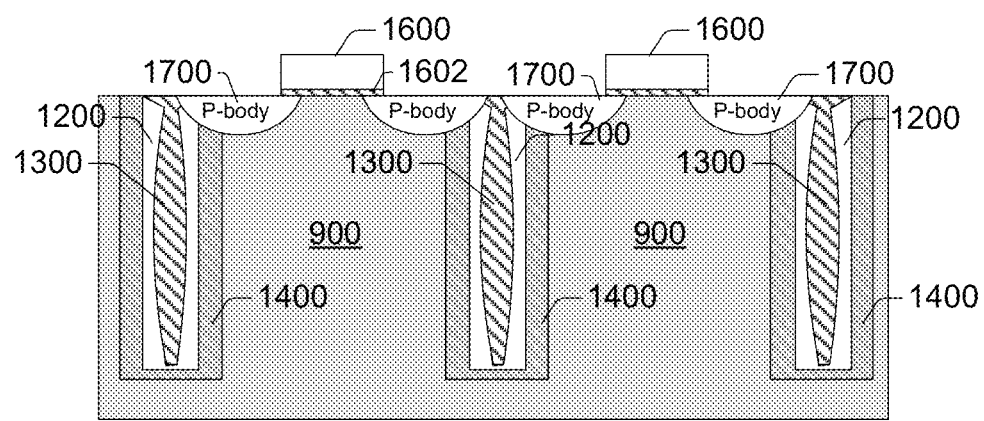

In FIG. 17, p-type body regions 1700 are formed.

Figure 18:
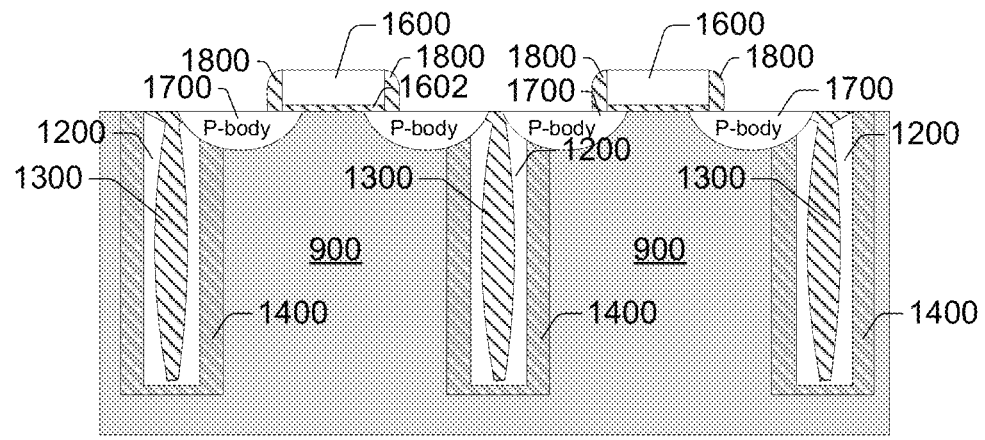

In FIG. 18, sidewall spacers 1800 are formed about the respective gate electrodes 1600.

Figure 19:
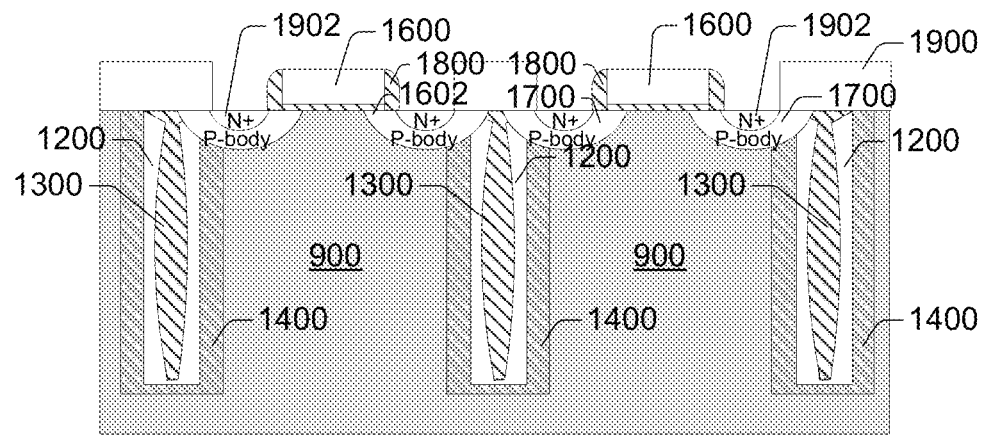

In FIG. 19, another hard mask layer is formed and patterned 1900, and N+ source regions 1902 are formed by ion implantation, for example, with the hard mask 1900 in place.

Thus, it will be appreciated that some embodiments relate to a high-voltage super junction device. The device includes a semiconductor substrate region having a first conductivity type and having neighboring trenches disposed therein. The neighboring trenches each have trench sidewalls and a trench bottom surface. A region having a second conductivity type is disposed in or adjacent to a trench and meets the semiconductor substrate region at a p-n junction. A gate electrode is formed on the semiconductor substrate region and electrically is electrically isolated from the semiconductor substrate region by a gate dielectric. A body region having the second conductivity type is disposed on opposite sides of the gate electrode near a surface of the semiconductor substrate. A source region having the first conductivity type is disposed within in the body region on opposite sides of the gate electrode near the surface of the semiconductor substrate.

Other embodiments relate to an integrated circuit that has a semiconductor substrate region of a first conductivity type. Neighboring trenches, each of which has trench sidewalls and a trench bottom surface, are formed in the semiconductor substrate. An epitaxial layer, which has a second conductivity type, is disposed in the neighboring trenches along the trench sidewalls and along the trench bottom surface. An out-diffused region, which has the second conductivity type, is disposed in the substrate under the bottom trench surface and about the trench sidewalls. The out-diffused region meets the semiconductor substrate region at a p-n junction deep in the substrate. A gate electrode is disposed over a surface of the semiconductor substrate region and is electrically isolated from the semiconductor substrate region by a gate dielectric. A body region, which has the second conductivity type, is disposed on opposite sides of the gate electrode near the surface of the semiconductor substrate. A source region, which has the first conductivity type, is disposed within the body region on opposite sides of the gate electrode near the surface of the semiconductor substrate. A drain region is arranged on a backside of the semiconductor substrate.

Still other embodiments relate to a method of forming an integrated circuit. In this method, a semiconductor substrate region, which has a first conductivity type, is provided. Trenches are formed in the semiconductor substrate region. An epitaxial (EPI) liner, which has a second conductivity type, is formed in the trenches. A thermal treatment is performed to out-diffuse dopants from the EPI liner into a surrounding portion of the semiconductor substrate region, thereby forming an out-diffused region having the second conductivity type. A gate dielectric and a gate electrode are formed over the semiconductor substrate region between neighboring trenches. Body regions are formed at least partially under the gate electrode in the semiconductor substrate region, and source regions are formed on opposite sides of the gate electrode and adjacent to the body regions.

It will be appreciated that identifiers such as "first" and "second" do not imply any type of ordering, placement, or temporal relationship with respect to other elements; but rather "first" and "second" and other similar identifiers are just generic identifiers and these elements can be swapped in other implementations. Thus, while methods illustrated and described herein may be illustrated and/or described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. An integrated circuit, comprising:
   a semiconductor substrate region having a first conductivity type and having neighboring trenches disposed therein, wherein the neighboring trenches each have trench sidewalls and a trench bottom surface;
   an epitaxial (EPI) layer having a second conductivity type and lining trench sidewalls and bottom trench surfaces of the neighboring trenches without entirely filling the neighboring trenches;

a dielectric disposed over the EPI layer to fill the neighboring trenches, wherein the dielectric includes outer dielectric sidewalls which abut the EPI layer and which extend inwardly from an uppermost region of the dielectric at an uppermost surface of the substrate to a neck region beneath the uppermost surface of the substrate before tapering outwardly to a waist region and then extending inwardly again toward the bottom of a trench;

an out-diffused region having the second conductivity type and disposed in the semiconductor substrate under the bottom trench surfaces and about the trench sidewalls;

a gate electrode formed on the semiconductor substrate region and electrically isolated from the semiconductor substrate region by a gate dielectric;

a body region having the second conductivity type and disposed on opposite sides of the gate electrode near a surface of the semiconductor substrate, and a source region having the first conductivity type and disposed within the body region on opposite sides of the gate electrode near the uppermost surface of the semiconductor substrate.

2. The integrated circuit of claim 1, wherein the epitaxial (EPI) layer disposed in the trench is selectively grown by epitaxy on the trench sidewalls and bottom trench surfaces.

3. The integrated circuit of claim 2, wherein the dielectric comprises an oxide region disposed within the trench and over the EPI layer.

4. The integrated circuit of claim 3, wherein the EPI sidewalls are thicker at upper and lower portions of the trench and which are thinner at a middle portion of the trench.

5. The integrated circuit of claim 3, wherein the trench has a height to width aspect ratio greater than approximately 10:1 and less than approximately 50:1.

6. The integrated circuit of claim 3, wherein a depth of the trench is approximately between approximately 30 μm and approximately 40 μm, and wherein a width of the trench is between approximately 1 μm and approximately 2 μm.

7. An integrated circuit, comprising:
a semiconductor substrate region having a first conductivity type and having neighboring trenches disposed therein, wherein the neighboring trenches each have trench sidewalls and a trench bottom surface;
an epitaxial (EPI) layer having a second conductivity type and disposed in the neighboring trenches along the trench sidewalls and along the trench bottom surface;
an oxide disposed over the EPI layer to fill the neighboring trenches, wherein the oxide includes outer oxide sidewalls which abut the EPI layer and which extend inwardly from an uppermost region of the oxide at an uppermost surface of the substrate to a neck region beneath the uppermost surface of the substrate before tapering outwardly to a waist region and then extending inwardly again toward the bottom of a trench;
an out-diffused region having the second conductivity type and disposed in the substrate under the bottom trench surface and about the trench sidewalls, the out-diffused region meeting the semiconductor substrate region at a p-n junction deep in the substrate;
a gate electrode disposed over a surface of the semiconductor substrate region and electrically isolated from the semiconductor substrate region by a gate dielectric;
a body region having the second conductivity type and disposed on opposite sides of the gate electrode near the surface of the semiconductor substrate;
a source region having the first conductivity type and disposed within the body region on opposite sides of the gate electrode near the surface of the semiconductor substrate; and
a drain region on a backside of the semiconductor substrate.

8. The integrated circuit of claim 7, wherein the trench has a height to width aspect ratio greater than approximately 10:1 and less than approximately 50:1.

9. The integrated circuit of claim 7, wherein a depth of the trench is approximately between approximately 30 μm and approximately 40 μm, and wherein a width of the trench is between approximately 1 μm and approximately 2 μm.

10. An integrated circuit, comprising:
a semiconductor substrate of a first conductivity type and having a front side and a backside, wherein the semiconductor substrate includes neighboring trenches extending from the front side into the semiconductor substrate, wherein the neighboring trenches each have trench sidewalls and a trench bottom surface;
an epitaxial (EPI) layer having a second conductivity type and lining the neighboring trenches along the trench sidewalls and along the trench bottom surfaces;
an oxide disposed over the EPI layer to fill the neighboring trenches, wherein the oxide includes outer oxide sidewalls which abut the EPI layer and which extend inwardly from an uppermost region of the oxide at an uppermost surface of the substrate to a neck region beneath the uppermost surface of the substrate before tapering outwardly to a waist region and then extending inwardly again toward the bottom of a trench;
an out-diffused region having the second conductivity type and disposed in the substrate under the bottom trench surfaces and about the trench sidewalls, the out-diffused region emanating from the EPI layer and meeting the semiconductor substrate at a p-n junction in the substrate;
a gate electrode disposed between the neighboring trenches over the front side of the semiconductor substrate and electrically isolated from the semiconductor substrate by a gate dielectric;
a body region having the second conductivity type and disposed under an outer perimeter of the gate electrode beneath the front side of the semiconductor substrate, the body region abutting the out-diffused region;
a source region having the first conductivity type and disposed within the body region beneath the front side of the semiconductor substrate, the source region being separated from the substrate by the body region; and
a drain region contact on the backside of the semiconductor substrate.

11. The integrated circuit of claim 10, wherein the oxide fills the trench and extends to an uppermost portion of the trench corresponding to the front side of the substrate.

12. The integrated circuit of claim 11, wherein the trench has a height to width aspect ratio greater than approximately 10:1 and less than approximately 50:1.

* * * * *